United States Patent
Sohn et al.

(10) Patent No.: US 7,358,827 B2
(45) Date of Patent: Apr. 15, 2008

(54) PROCESS-INSENSITIVE SELF-BIASING PHASE LOCKED LOOP CIRCUIT AND SELF-BIASING METHOD THEREOF

(75) Inventors: Young-soo Sohn, Gunpo-si (KR); Jae-hyung Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 73 days.

(21) Appl. No.: 11/487,545

(22) Filed: Jul. 14, 2006

(65) Prior Publication Data

US 2007/0018736 A1 Jan. 25, 2007

(30) Foreign Application Priority Data

Jul. 25, 2005 (KR) .................. 10-2005-0067289

(51) Int. Cl.
*H03L 7/093* (2006.01)
(52) U.S. Cl. ........................................ 331/185; 331/17
(58) Field of Classification Search ................ 331/185, 331/186, 17, 16
See application file for complete search history.

(56) References Cited

U.S. PATENT DOCUMENTS

| | | | | |
|---|---|---|---|---|
| 5,334,953 | A * | 8/1994 | Mijuskovic | 331/8 |
| 6,710,670 | B2 * | 3/2004 | Maneatis | 331/185 |
| 7,042,277 | B2 * | 5/2006 | Cranford et al. | 327/538 |
| 2005/0068073 | A1 | 3/2005 | Shi et al. | |

FOREIGN PATENT DOCUMENTS

| | | |
|---|---|---|
| JP | 2000-269810 | 9/2000 |
| JP | 2001-326574 | 11/2001 |
| JP | 2004-112157 | 4/2004 |

OTHER PUBLICATIONS

Kun-Yung Ken Chang, et al., "Quad Transceiver Cell Using On-Chip Regulated Dual Loop PLLs", IEEE Journal of Solid-State Circuits, vol. 38, No. 5, May 2003, S. pp. 747-754.

* cited by examiner

*Primary Examiner*—Joseph Chang
(74) *Attorney, Agent, or Firm*—Mills & Onello LLP

(57) ABSTRACT

A process-insensitive self-biasing PLL circuit and self-biasing method thereof prevent deterioration of loop stability even when there is a fabrication process variation. The self-biasing PLL circuit includes a phase frequency detector, a main charge pump circuit, an auxiliary charge pump circuit, a first operational amplifier, a second operational amplifier, a voltage-controlled oscillator, a divider, and a bias circuit. In the self-biasing PLL circuit, the first operational amplifier amplifies the voltage of a loop filter capacitor and the second operational amplifier serving as a regulator amplifies the output voltage of the first operational amplifier. The output voltage of the second operational amplifier is used as a control voltage of the voltage-controlled oscillator. Particularly, the bias circuit generates a first bias current using an NMOS transistor, generates a second bias current using a PMOS transistor, and sums up the first and second bias currents to generate a third bias current in response to the output voltage of the second operational amplifier. The first bias current is provided to the main charge pump circuit and the auxiliary charge pump circuit as their bias currents, and the third bias current is provided to the first operational amplifier as its bias current.

12 Claims, 4 Drawing Sheets

PROCESS-INSENSITIVE SELF-BIASING PHASE LOCKED LOOP CIRCUIT AND SELF-BIASING METHOD THEREOF

CROSS-REFERENCE TO RELATED PATENT APPLICATION

This application claims priority to Korean Patent Application No. 10-2005-0067289, filed on Jul. 25, 2005, in the Korean Intellectual Property Office, the disclosure of which is incorporated herein in its entirety by reference.

BACKGROUND OF THE INVENTION

1. Field of the Invention

The present invention relates to a phase locked loop (PLL), and more particularly, to a process-insensitive self-biasing PLL circuit and a self-biasing method thereof.

2. Description of the Related Art

A PLL circuit compares the phase of an input clock signal with the phase of an output clock signal to make the phases of the two signals correspond with each other. The PLL circuit is frequently used in a semiconductor integrated circuit such as a memory. Particularly, a self-biasing PLL circuit is used to secure loop stability over a wide frequency range. A conventional self-biasing PLL circuit is disclosed in "A 0.4-4 Gb/s CMOS Quad Transceiver Cell Using On-Chip Regulated Dual-Loop PLLs" described in "IEEE Journal of Solid State Circuits, Vol. 38, No. 5, pp. 747-754, May 2003".

FIG. 1 is a block diagram of a conventional self-biasing PLL circuit. Referring to FIG. 1, the conventional self-biasing PLL circuit includes a phase frequency detector 11, a main charge pump circuit 12, an auxiliary charge pump circuit 13, a loop filter capacitor Cp, a first operational amplifier 14, a second operational amplifier 15, a voltage-controlled oscillator 16, a duty corrector 17, a divider 18, and a bias circuit 19.

In FIG. 1, ICLK represents an input clock signal, and FCLK denotes a feedback clock signal generated by frequency division by the divider 18. UP and DN respectively represent an up signal and a down signal generated by the phase frequency detector 11 to control the charge pump circuits 12 and 13.

In the conventional self biasing PLL circuit having the aforementioned configuration, the bandwidth of the loop is determined in proportion to an operating frequency. That is, the loop bandwidth is increased as the operating frequency is increased, but is decreased as the operating frequency is decreased. Furthermore, the position of loop zero used for loop stability is moved in proportion to the loop bandwidth.

It is important to maintain the proportional relationship of the operating frequency, loop bandwidth and loop zero for stability of the PLL circuit. To maintain the proportional relationship, the self-biasing circuit controls bias currents of the main charge pump circuit 12, the auxiliary charge pump circuit 13, the first operational amplifier 14, and the second operational amplifier 15 on the basis of a control voltage Vc with respect to the voltage-controlled oscillator 16. In other words, the bias circuit 19 generates a bias current In in response to the control voltage Vc corresponding to the output voltage of the second operational amplifier 15 and provides the bias current In as the bias currents of the main charge pump circuit 12, the auxiliary charge pump circuit 13, the first operational amplifier 14 and the second operational amplifier 15.

In the conventional self-biasing PLL circuit shown in FIG. 1, however, the bias circuit 19 is configured to generate the bias current In using only an NMOS transistor. Accordingly, loop stability is deteriorated because the position of loop zero is not proportional to the loop bandwidth when the NMOS transistor characteristic and the PMOS transistor characteristic are varied in different directions due to variations in semiconductor fabrication process conditions.

The problem of the conventional self-biasing PLL circuit will now be explained in more detail.

The frequency Fvco of the voltage-controlled oscillator 16 of the conventional self-biasing PLL circuit is represented by Equation 1, the loop bandwidth LOOP BW is represented by Equation 2, and loop zero LOOP ZR is represented by Equation 3.

$$Fvco = a1(gmn+gmp)/C \qquad \text{[Equation 1]}$$

$$LOOP\ BW = Ipmp*Kvco/Gm = a2(gmn+gmp) \qquad \text{[Equation 2]}$$

$$LOOP ZR = Gm/C = a3*gmn \qquad \text{[Equation 3]}$$

Here, gmn and gmp denote transconductances of an NMOS transistor and a PMOS transistor included in the voltage-controlled oscillator 16, respectively. Ipmp represents the current of the main charge pump circuit 12, which is proportional to gmn, and Gm denotes transconductance of the first operational amplifier 14, which is also proportional to gmn. In addition, a1, a2 and a3 denote proportional factors.

From Equations 1, 2 and 3, it can be known that the frequency Fvco of the voltage-controlled oscillator 16 and the loop bandwidth LOOP BW are proportional to the sum of gmn and gmp but loop zero LOOP ZR is proportional to only gmn in the conventional self-biasing PLL circuit.

When NMOS transistor characteristics and PMOS transistor characteristics are varied in the same direction in a semiconductor fabrication process, for example, when both operating speeds of NMOS and PMOS transistors are increased or decreased, the aforementioned proportional relationship is maintained. However, when the NMOS transistor characteristics and PMOS transistor characteristics are varied in different directions in the semiconductor fabrication process, for example, when the operating speed of the NMOS transistor is increased while the operating speed of the PMOS transistor is decreased or when the operating speed of the NMOS transistor is decreased while the operating speed of the PMOS transistor is increased, the aforementioned proportional relationship may not be maintained. In this case, loop stability is deteriorated to cause an erroneous operation of the self-biasing PLL circuit in a worst case scenario.

As described above, the conventional self-biasing PLL circuit is sensitive to a variation in the semiconductor fabrication process and thus loop stability may be deteriorated depending on the process circumstances.

SUMMARY OF THE INVENTION

The present invention provides a self-biasing PLL circuit which is insensitive to a fabrication process variation such that loop stability is not deteriorated even when fabrication process variation is present.

The present invention also provides a self-biasing method of the self-biasing PLL circuit for preventing loop stability from being deteriorated even when fabrication process variation is present.

According to an aspect of the present invention, there is provided a self-biasing PLL circuit including a phase frequency detector, a main charge pump circuit, an auxiliary charge pump circuit, a first amplifier, a second amplifier, a voltage-controlled oscillator, a divider, and a bias circuit. The phase frequency detector compares an input clock signal to a feedback clock signal to generate an up signal and a down signal. The main charge pump circuit provides charge to a loop filter capacitor connected to the output terminal thereof in response to the up signal and the down signal. The auxiliary charge pump circuit provides charge to the output terminal of the first amplifier in response to the up signal and the down signal. The first amplifier amplifies the voltage of the loop filter capacitor. The second amplifier amplifies the output voltage of the first amplifier. The voltage-controlled oscillator generates an oscillating clock signal in response to the output voltage of the second amplifier. The divider frequency-divides the oscillating clock signal to generate the feedback clock signal. The bias circuit generates a first bias current using an NMOS transistor, generates a second bias current using a PMOS transistor, and sums the first and second bias currents to generate a third bias current in response to the output voltage of the second amplifier. The first bias current is provided as bias currents to the main charge pump circuit and the auxiliary charge pump circuit and the third bias current is provided as a bias current to the first amplifier.

In one embodiment, the bias circuit includes the NMOS transistor providing the first bias current in response to the output voltage of the second amplifier, a first current mirror mirroring the first bias current to a common output terminal, the PMOS transistor providing the second bias current using the output voltage of the second amplifier as a power supply voltage, a second current mirror mirroring the second bias current, and a third current mirror mirroring the second bias current mirrored by the second current mirror to the common output terminal. The mirrored first bias current and the mirrored second bias current are summed up at the common output terminal to generate the third bias current.

In another embodiment, the NMOS transistor has a drain connected to the first current mirror, a source connected to a ground voltage, and a gate receiving the output voltage of the second amplifier.

In another embodiment, the first current mirror is a P-type current mirror.

In another embodiment, the PMOS transistor has a source receiving the output voltage of the second amplifier, a drain connected to the second current mirror, and a gate connected to a ground voltage.

In another embodiment, the second current mirror is an N-type current mirror.

In another embodiment, the third current mirror is a P-type current mirror.

In another embodiment, the first and second amplifiers are operational amplifiers.

According to another aspect of the present invention, there is provided a self-biasing method of the phase locked loop including the phase frequency detector, the main charge pump circuit, the first amplifier, the auxiliary charge pump circuit, the second amplifier, the voltage-controlled oscillator, and the divider, comprising: generating a first bias current using an NMOS transistor in response to the output voltage of the second amplifier; generating a second bias current using a PMOS transistor in response to the output voltage of the second amplifier; summing the first and second bias currents to generate a third bias current; providing the first bias current as bias currents to the main charge pump circuit and the auxiliary charge pump circuit; and providing the third bias current as a bias current to the first amplifier.

In one embodiment, generating the first bias current comprises applying a ground voltage to the source of the NMOS transistor and applying the output voltage of the second amplifier to the gate of the NMOS transistor. Generating the second bias current comprises applying the output voltage of the second amplifier to the source of the PMOS transistor and applying the ground voltage to the gate of the PMOS transistor.

In another embodiment, generating the third bias current comprises: mirroring the first bias current to a common output terminal; mirroring the second bias current; mirroring the mirrored second bias current to the common output terminal; and summing up the mirrored first bias current and the mirrored second bias current at the common output terminal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS OF THE INVENTION

Figure 1:
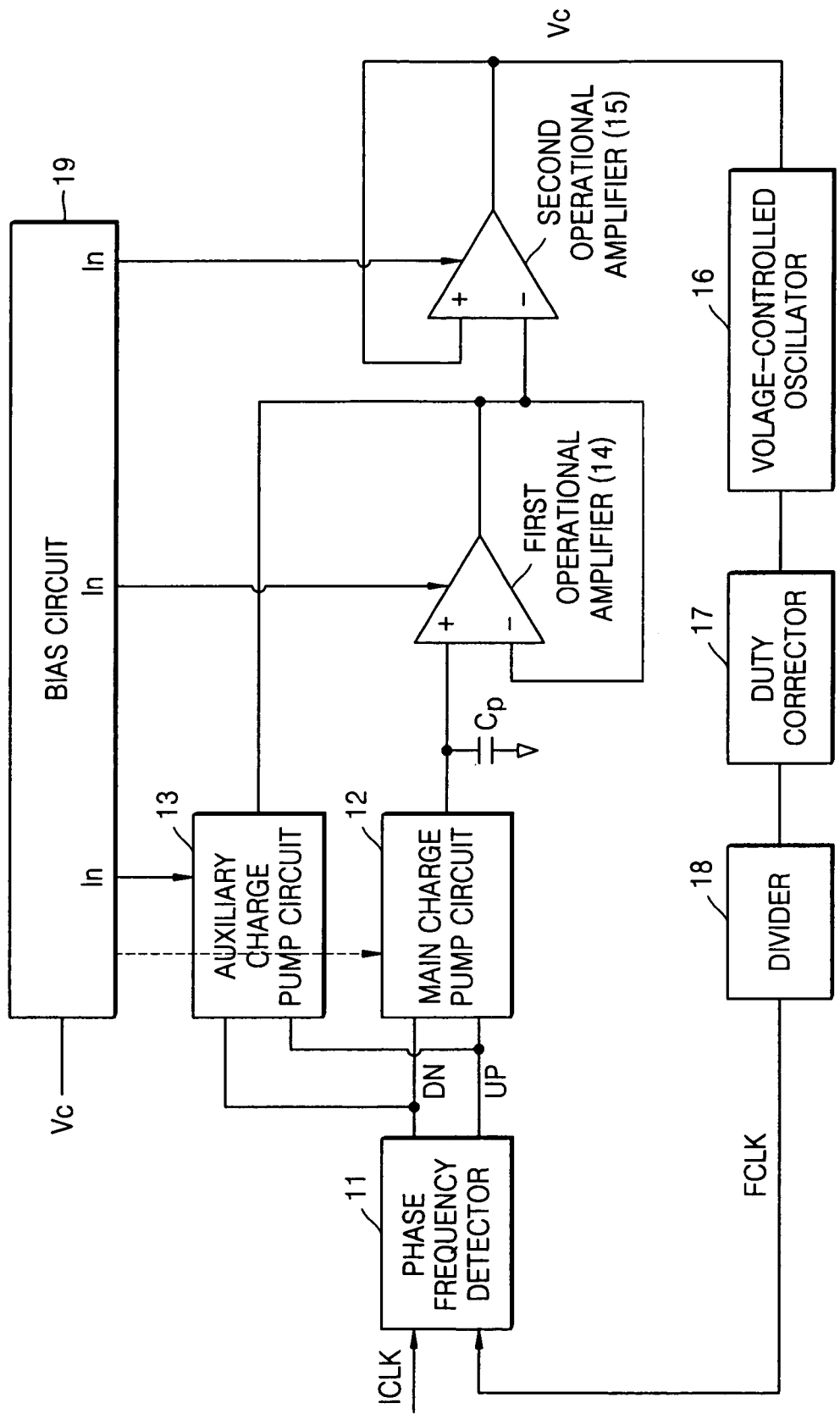
FIG. 1 is a block diagram of a conventional self-biasing PLL circuit.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete. Throughout the drawings, like reference numerals refer to like elements.

Figure 2:
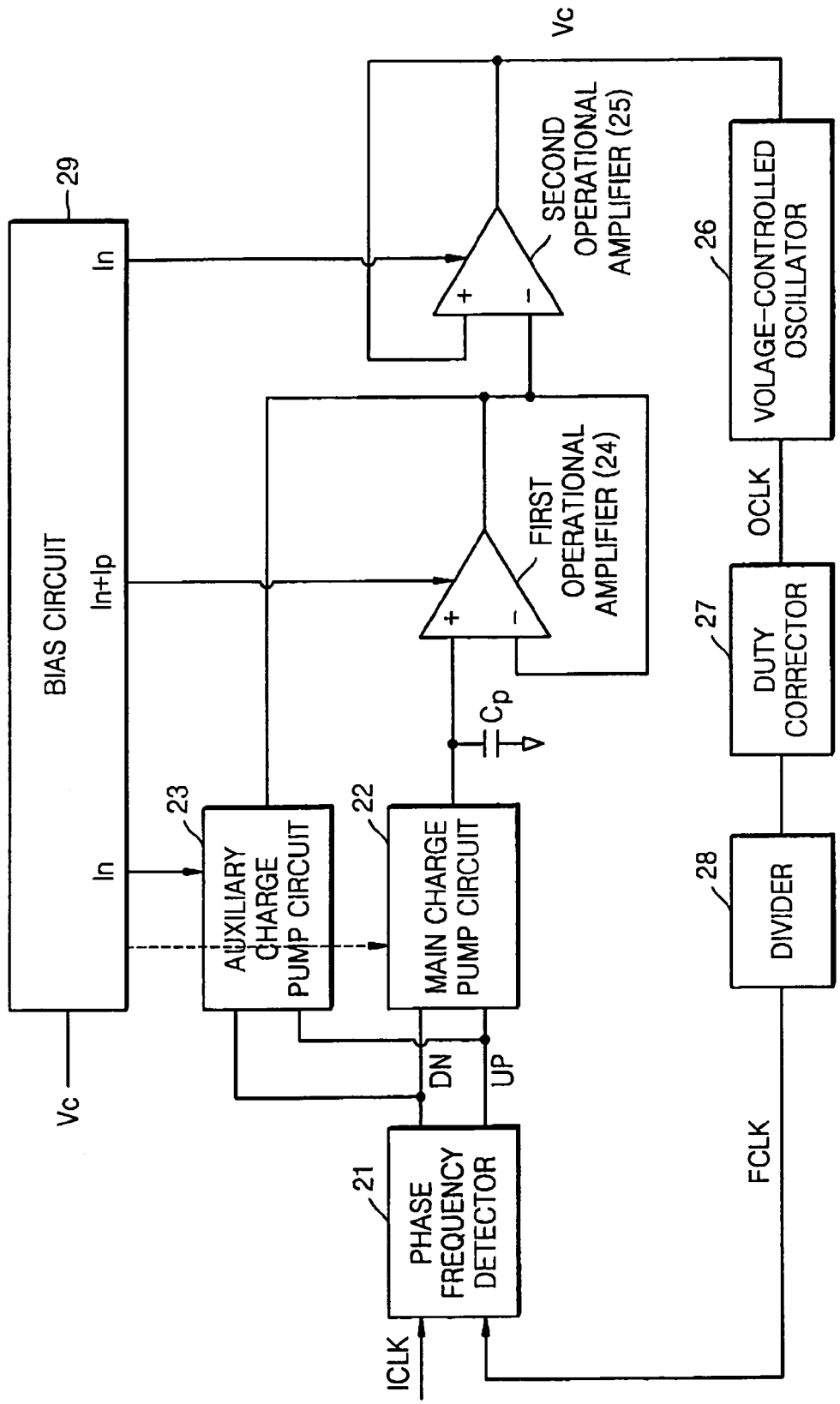
FIG. 2 is a block diagram of a self-biasing PLL circuit according to an embodiment of the present invention.

FIG. 2 is a block diagram of a self-biasing PLL circuit according to an embodiment of the present invention. Referring to FIG. 2, the self-biasing PLL circuit according to an embodiment of the present invention includes a phase frequency detector 21, a main charge pump circuit 22, an auxiliary charge pump circuit 23, a loop filter capacitor Cp, a first operational amplifier 24, a second operational amplifier 25, a voltage-controlled oscillator 26, a duty corrector 27, a divider 28, and a bias circuit 29. The self-biasing PLL circuit may not necessarily include the duty corrector 27 which is optional.

The phase frequency detector 21 compares an input clock signal ICLK to a feedback clock signal FCLK to generate an up signal UP and a down signal DN. The main charge pump circuit 22 provides charge to the loop filter capacitor Cp in response to the up signal UP and the down signal DN. The first operational amplifier 24 amplifies the voltage of the loop filter capacitor Cp and outputs the amplified voltage. The auxiliary charge pump circuit 23 provides charge to the output terminal of the first operational amplifier 24 in response to the up signal UP and the down signal DN. The auxiliary charge pump circuit 23 and the first operational amplifier 24 generate a loop zero to stabilize the loop.

The second operational amplifier 25 amplifies the output voltage of the first operational amplifier 24 and provides the amplified voltage to the voltage-controlled oscillator 26 as the control voltage Vc. The second operational amplifier 25 operates as a type of regulator and regulates the control voltage Vc. The voltage-controlled oscillator 26 generates an oscillating clock signal OCLK in response to the output voltage of the second operational amplifier 25, that is, the control voltage Vc. The duty corrector 27 corrects the duty of the oscillating clock signal OCLK. The divider 28 frequency-divides the clock signal whose duty has been corrected by the duty corrector 27 to generate the feedback clock signal FCLK.

Particularly, the bias circuit 29 is configured such that it is operated according to the self-biasing method of the present invention. Specifically, the bias circuit 29 generates a first bias current In using an NMOS transistor, generates a second bias current Ip using a PMOS transistor, and sums up the first and second bias currents In and Ip to generate a third bias current In+Ip. The first bias current in is provided to the main charge pump circuit 22 and the auxiliary charge pump circuit 23 as their bias currents. The third bias current In+Ip is provided to the first operational amplifier 24 as its bias current.

The second operational amplifier 25 uses the first bias current In as its bias current and it can be configured to use the second bias current Ip if required.

The phase frequency detector 21, the voltage-controlled oscillator 26, the duty corrector 27, and the divider 28 are well-known to those skill in the art so that detailed explanations therefore are omitted. The configurations of the bias circuit 29 that is the core component of the self-biasing PLL circuit of the present invention, and the first operational amplifier 24 and the charge pump circuits 22 and 23 directly related to the bias circuit 29 will be explained in detail. The configuration of the second operational amplifier 25 is similar to that of the first operational amplifier 24 so that explanation therefore will be omitted.

Figure 3:
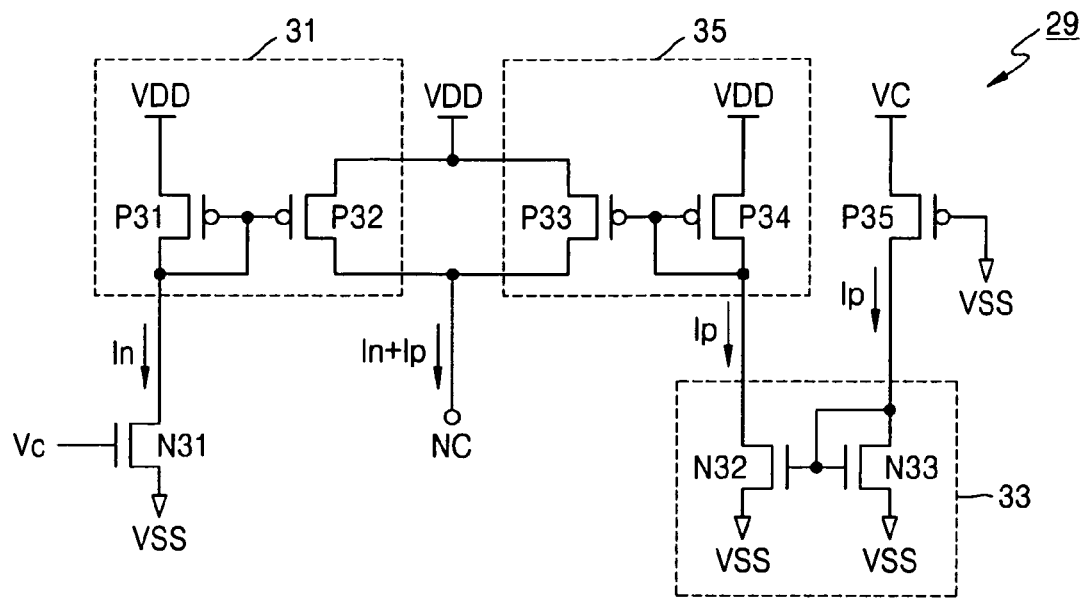
FIG. 3 is a circuit diagram of the bias circuit shown in FIG. 2.

FIG. 3 is a circuit diagram of the bias circuit 29 shown in FIG. 2. Referring to FIG. 3, the bias circuit 29 includes an NMOS transistor N31 supplying the first bias current In in response to the output voltage of the second operational amplifier 25 shown in FIG. 2, that is, the control voltage Vc, and a PMOS transistor P35 supplying the second bias current Ip using the control voltage Vc as a power supply voltage.

Furthermore, the bias circuit 29 includes a first current mirror 31 mirroring the first bias current In to a common output terminal NC, a second current mirror 33 mirroring the second bias current Ip, and a third current mirror 35 mirroring the second bias current mirrored by the second current mirror 33 to the common output terminal NC. The mirrored first and second bias currents are summed up at the common output terminal NC to generate the third bias current In+Ip.

More specifically, the NMOS transistor N31 has a drain connected to the first current mirror 31, a source receiving a ground voltage VSS, and a gate receiving the control voltage Vc. The first current mirror 31 is a P type current mirror and consists of PMOS transistors P31 and P32. The PMOS transistor P35 has a source receiving the control voltage Vc, a drain connected to the second current mirror 33, and a gate receiving the ground voltage VSS. The second current mirror 33 is an N type current mirror and consists of NMOS transistors N32 and N33. The third current mirror 35 is a P type current mirror and consists of PMOS transistors P33 and P34.

Figure 4:
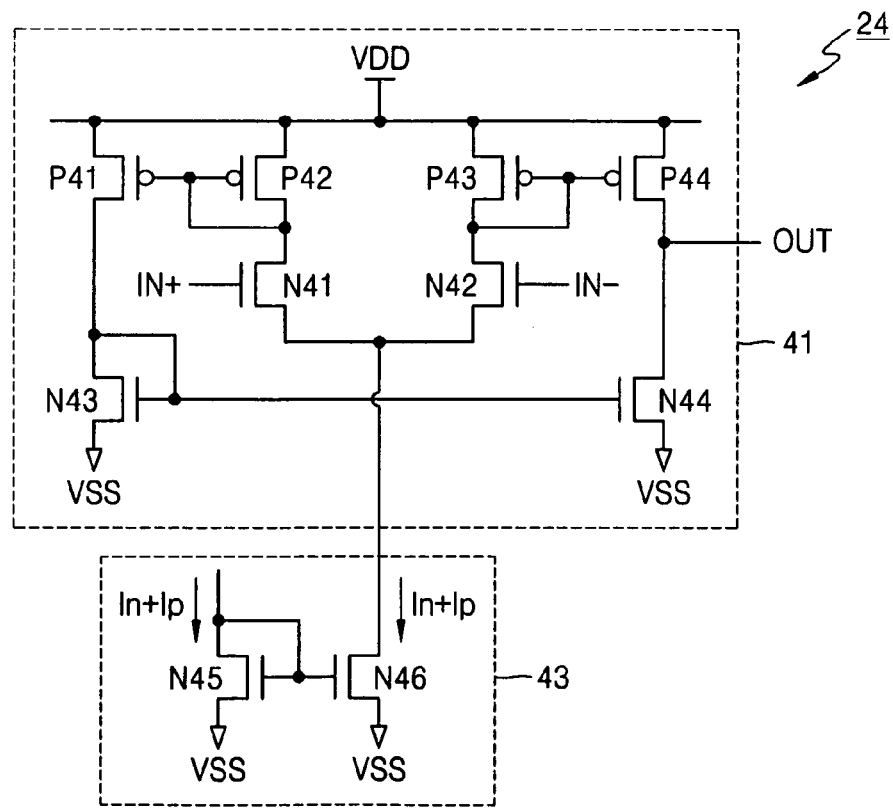
FIG. 4 is a circuit diagram of the first operational amplifier shown in FIG. 2.

FIG. 4 is a circuit diagram of the first operational amplifier 24 shown in FIG. 2. Referring to FIG. 4, the first operational amplifier 24 includes an amplification circuit 41 and a current mirror 43. The current mirror 43 receives the third bias current In+Ip from the bias circuit 29 and mirrors the third bias current In+Ip. The third bias current In+Ip mirrored by the current mirror 43 is used as the bias current of the amplification circuit 41. The current mirror 43 is an N type current mirror and consists of NMOS transistors N45 and N46.

The amplification circuit 41 compares and amplifies signals respectively input through a positive input port IN+ and a negative input port IN− and outputs an output signal through an output port OUT. The amplification circuit 41 is a differential pair current mirror type circuit and consists of PMOS transistors P41, P42, P43 and P44 and NMOS transistors N41, N42, N43 and N44. The positive input port IN+ is connected to the loop filter capacitor Cp shown in FIG. 2 and the negative input port IN− is commonly connected to the output port OUT. The configuration and operation of the amplification circuit 41 are well-known to those skill in the art so that detailed explanation therefore is omitted.

Figure 5:
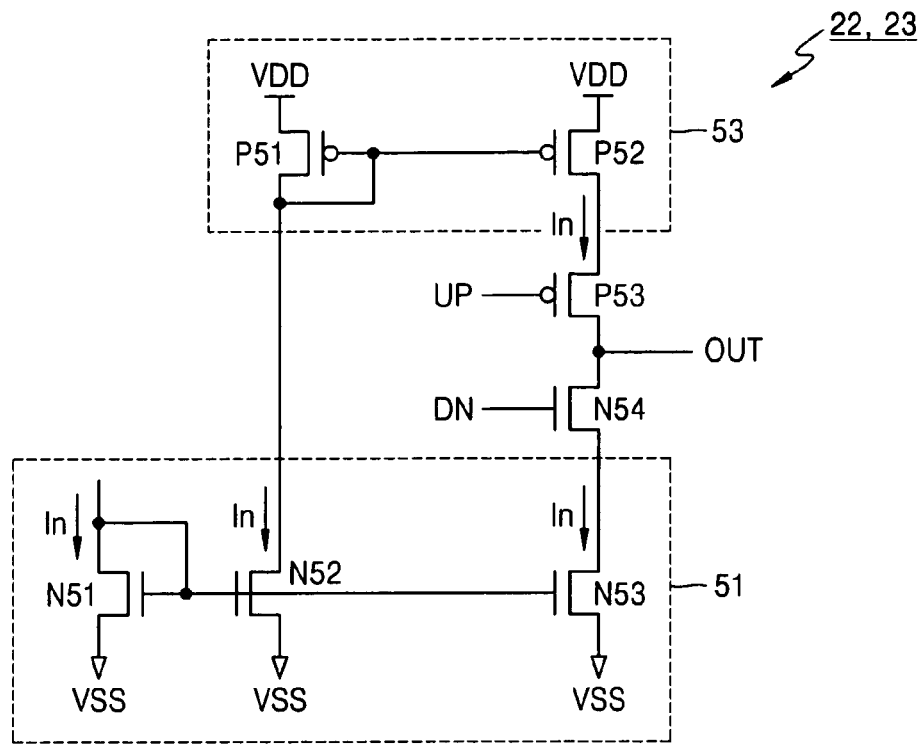
FIG. 5 is a circuit diagram of the charge pump circuits shown in FIG. 2.

FIG. 5 is a circuit diagram of the charge pump circuits 22 and 23 shown in FIG. 2. Referring to FIG. 5, Each of the charge pump circuits 22 and 23 includes a first current mirror 51, a second current mirror 53, a PMOS switch transistor P53 controlled by the up signal UP, and an NMOS switch transistor N54 controlled by the down signal DN.

The first current mirror 51 receives the first bias current In from the bias current 29 and mirrors the first bias current In. The first current mirror 51 is of N type and consists of NMOS transistors N51, N52 and N53. The NMOS transistors N51 and N52 form one current mirror and the NMOS transistors N51 and N53 form another current mirror.

The second current mirror 53 mirrors the first bias current In mirrored by the first current mirror 51. The second current mirror 53 is of P type and consists of PMOS transistors P51 and P52. Accordingly, the mirrored first bias current In flows through the PMOS transistor P52 and the PMOS switch transistor P53 when the up signal UP is activated to a logic low level to turn on the PMOS switch transistor P53. When the down signal DN is activated to a logic high level to turn on the NMOS switch transistor N54, the mirrored first bias current In flows through the NMOS switch transistor N54 and the NMOS transistor N53.

As described above, in the self-biasing PLL circuit according to the present invention, the third bias current In+Ip corresponding to the sum of the first bias current In generated by the NMOS transistor N31 in the bias circuit 29 and the second bias current Ip generated by the PMOS transistor P35 is provided to the first operational amplifier 24. The first operational amplifier 24 uses the third bias current In+Ip as its bias current.

Accordingly, the bias current of the first operational amplifier is proportional to the sum of gmn and gmp. Consequently, the loop bandwidth LOOP BW and loop zero LOOP ZR are exactly proportional to each other as described below. Here, gmn denotes transconductance of the NMOS transistor N31 generating the first bias current In and gmp represents transconductance of the PMOS transistor P35 generating the second bias current Ip.

Transconductance of the first operational amplifier 24 is represented as follows because the bias current of the first operational amplifier is proportional to the sum of gmn and gmp.

$$Gm = a4\sqrt{(\beta n(In + Ip))} = a4\sqrt{(\beta n(\beta n + \beta p)Vc^{\wedge}2)} \quad \text{[Equation 4]}$$

Accordingly, the loop bandwidth LOOP BW in the self-biasing PLL circuit according to the present invention is represented by Equation 5 and loop zero LOOP ZR is represented by Equation 6.

$$LOOP\,BW = Ipmp * Kvco\,/\,Gm =$$
$$a5 * \beta n(\beta n + \beta p)vc^{\wedge}2\,/\,\sqrt{\beta n(\beta n + \beta p)vc^{\wedge}2} =$$
$$a5\sqrt{\beta n(\beta n + \beta p)vc^{\wedge}2} \quad \text{[Equation 5]}$$

$$LOOP\,ZR = Gm\,/\,C = a6\sqrt{(\beta n(\beta n + \beta p)vc^{\wedge}2)} \quad \text{[Equation 6]}$$

Here, a4, a5 and a6 denote proportional factors. βn denotes a value corresponding to (μ*Cox*W/L) of the NMOS transistor N31 and βp represents a value corresponding to (μ*Cox*W/L) of the PMOS transistor P31. Here, μ denotes mobility, Cox represents oxide capacitance, and W and L respectively denote the width and length of the corresponding transistor. In addition, In denotes the first bias current generated by the NMOS transistor N31, and Ip represents the second bias current Ip generated by the PMOS transistor P35. Vc is the output voltage of the second operational amplifier 25, that is, the control voltage Vc.

From Equations 4 and 5, it can be known that the loop bandwidth LOOP BW and loop zero LOOP ZR are exactly proportional to each other in the self-biasing PLL circuit according to the present invention. Accordingly, the loop bandwidth LOOP BW and loop zero LOOP ZR can maintain a specific proportional relationship between themselves even when the NMOS transistor characteristics and PMOS transistor characteristics are varied in opposite directions due to a variation in the fabrication process. In other words, the loop bandwidth LOOP BW and loop zero LOOP ZR can maintain the specific proportional relationship between themselves even when the operating speed of the NMOS transistor is increased while the operating speed of the PMOS transistor is decreased or when the operating speed of the PMOS transistor is increased while the operating speed of the NMOS transistor is decreased.

Figure 6:
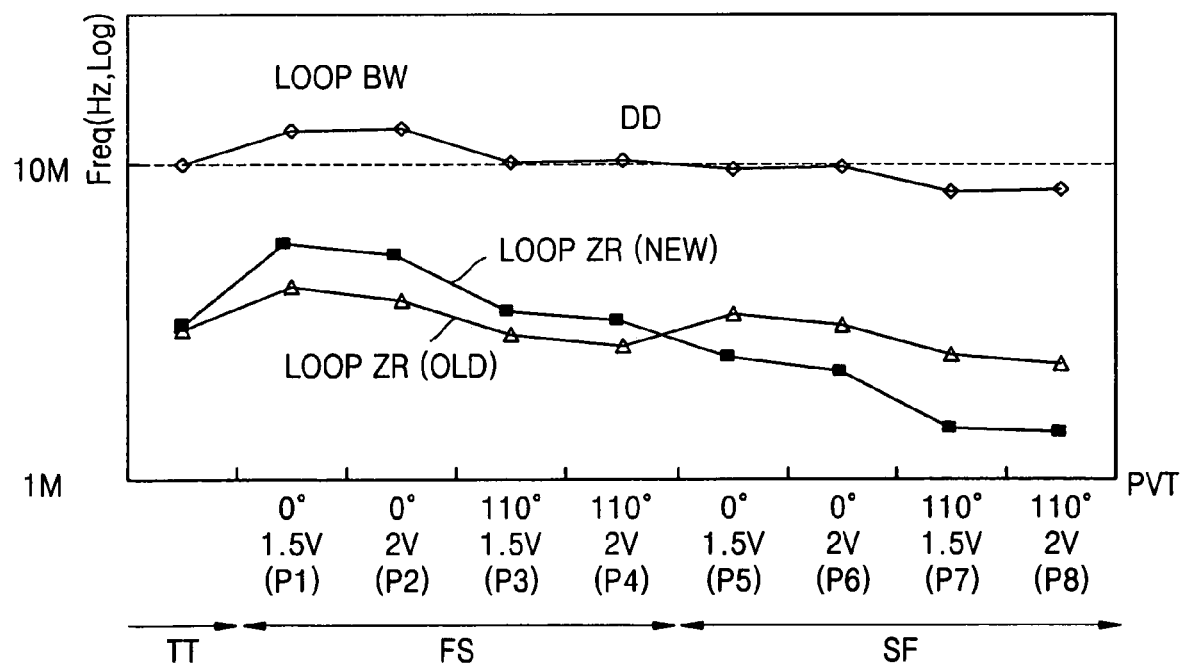
FIG. 6 illustrates a simulation result showing variations in the loop bandwidth and loop zero with respect to PVT in the conventional self-biasing PLL circuit of FIG. 1 and the self-biasing PLL circuit of the present invention shown in FIG. 2.

FIG. 6 illustrates a simulation result showing variations in the loop bandwidth and loop zero in response to PVT (Process Voltage Temperature) in the conventional self-biasing PLL circuit of FIG. 1 and the self-biasing PLL circuit of the present invention shown in FIG. 2. Here, assume that the loop bandwidth LOOP BW in the conventional self-biasing PLL circuit is identical to the loop bandwidth LOOP BW in the self-biasing PLL circuit of the present invention.

In FIG. 6, FS denotes a simulation process parameter when the NMOS transistor is rapidly operated and the PMOS transistor is slowly operated, and SF represents a simulation process parameter when the NMOS transistor is slowly operated and the PMOS transistor is rapidly operated. In addition, TT denotes a simulation process parameter when both the NMOS and PMOS transistors are normally operated.

For example, the simulation condition at a point P1 is that the simulation process parameter is FS, voltage is 1.5V and temperature is 0 degree. In this manner, simulation conditions at eight points P1 through P8 are determined and simulation is carried out based on the simulation conditions.

Referring to FIG. 6, the loop bandwidth LOOP BW and loop zero LOOP ZR cannot maintain a specific proportional relationship when the simulation process parameter is FS and when it is SF in the conventional self-biasing PLL circuit. On the contrary, the loop bandwidth LOOP BW and loop zero LOOP ZR maintain a specific proportional relationship in both cases where the simulation process parameter is FS and where it is SF in the self-biasing PLL circuit according to the present invention.

As described above, the self-biasing PLL circuit according to the present invention is insensitive to a fabrication process variation and thus the loop bandwidth LOOP BW and loop zero LOOP ZR can maintain a specific proportional relationship between themselves even when there is a fabrication process variation. As a result, loop stability is maintained.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A phase locked loop comprising:
   a phase frequency detector comparing an input clock signal to a feedback clock signal to generate an up signal and a down signal;
   a main charge pump circuit providing charge to a loop filter capacitor connected to an output terminal thereof in response to the up signal and the down signal;
   a first amplifier amplifying the voltage of the loop filter capacitor;
   an auxiliary charge pump circuit providing charge to an output terminal of the first amplifier in response to the up signal and the down signal;
   a second amplifier amplifying an output voltage of the first amplifier;
   a voltage-controlled oscillator generating an oscillating clock signal in response to an output voltage of the second amplifier;
   a divider frequency-dividing the oscillating clock signal to generate the feedback clock signal; and
   a bias circuit generating a first bias current using an NMOS transistor, generating a second bias current using a PMOS transistor, and summing the first and second bias currents to generate a third bias current in response to the output voltage of the second amplifier, wherein the first bias current is provided as bias currents to the main charge pump circuit and the auxiliary charge pump circuit and wherein the third bias current is provided as a bias current to the first amplifier.

2. The phase locked loop of claim 1, wherein the bias circuit comprises:
   the NMOS transistor providing the first bias current in response to the output voltage of the second amplifier;
   a first current mirror mirroring the first bias current to a common output terminal;

the PMOS transistor providing the second bias current using the output voltage of the second amplifier as a power supply voltage;

a second current mirror mirroring the second bias current; and a third current mirror mirroring the second bias current mirrored by the second current mirror to the common output terminal, wherein the mirrored first bias current and the mirrored second bias current are summed at the common output terminal to generate the third bias current.

3. The phase locked loop of claim 2, wherein the NMOS transistor has a drain connected to the first current mirror, a source connected to a ground voltage, and a gate receiving the output voltage of the second amplifier.

4. The phase locked loop of claim 2, wherein the first current mirror is a P-type current mirror.

5. The phase locked loop of claim 2, wherein the PMOS transistor has a source receiving the output voltage of the second amplifier, a drain connected to the second current mirror, and a gate connected to a ground voltage.

6. The phase locked loop of claim 2, wherein the second current mirror is an N-type current mirror.

7. The phase locked loop of claim 2, wherein the third current mirror is a P-type current mirror.

8. The phase locked loop of claim 1, wherein the first and second amplifiers are operational amplifiers.

9. A self-biasing method of a phase locked loop including a phase frequency detector comparing an input clock signal to a feedback clock signal to generate an up signal and a down signal, a main charge pump circuit providing charge to a loop filter capacitor connected to an output terminal thereof in response to the up signal and the down signal, a first amplifier amplifying the voltage of the loop filter capacitor, an auxiliary charge pump circuit providing charge to an output terminal of the first amplifier in response to the up signal and the down signal, a second amplifier amplifying an output voltage of the first amplifier, a voltage-controlled oscillator generating an oscillating clock signal in response to an output voltage of the second amplifier, and a divider frequency-dividing the oscillating clock signal to generate the feedback clock signal, comprising:

generating a first bias current using an NMOS transistor in response to the output voltage of the second amplifier;

generating a second bias current using a PMOS transistor in response to the output voltage of the second amplifier;

summing the first and second bias currents to generate a third bias current;

providing the first bias current as bias currents to the main charge pump circuit and the auxiliary charge pump circuit; and providing the third bias current as a bias current to the first amplifier.

10. The self-biasing method of claim 9, wherein the generating the first bias current comprises applying a ground voltage to the source of the NMOS transistor and applying the output voltage of the second amplifier to the gate of the NMOS transistor.

11. The self-biasing method of claim 9, wherein the generating the second bias current comprises applying the output voltage of the second amplifier to the source of the PMOS transistor and applying the ground voltage to the gate of the PMOS transistor.

12. The self-biasing method of claim 9, wherein the generating the third bias current comprises:

mirroring the first bias current to a common output terminal;

mirroring the second bias current;

mirroring the mirrored second bias current to the common output terminal; and summing the mirrored first bias current and the mirrored second bias current at the common output terminal.

\* \* \* \* \*